United States Patent [19]

Davis

[11] 4,072,870
[45] Feb. 7, 1978

[54] COMPARISON CIRCUIT HAVING PROGRAMMABLE HYSTERESIS

[75] Inventor: William F. Davis, Tempe, Ariz.

[73] Assignee: Motorola, Inc., Schaumburg, Ill.

[21] Appl. No.: 701,461

[22] Filed: June 30, 1976

[51] Int. Cl.² .............................................. H03K 5/20
[52] U.S. Cl. ..................................... 307/350; 307/354
[58] Field of Search ........... 307/235 R, 235 F, 235 T, 307/354, 350; 328/146, 147; 330/30 D

[56] References Cited

U.S. PATENT DOCUMENTS

| | | | |
|---|---|---|---|
| 3,467,837 | 9/1969 | Vick | 307/235 R |
| 3,538,444 | 11/1970 | Adlhoch | 328/146 |
| 3,622,802 | 11/1971 | Nunley | 307/235 R |
| 3,628,059 | 12/1971 | Niu | 330/30 D |
| 3,648,069 | 3/1972 | Frederiksen | 307/235 T |
| 3,725,673 | 4/1973 | Frederiksen et al. | 307/235 T |
| 3,872,323 | 3/1975 | Frederiksen et al. | 307/235 R |
| 3,914,704 | 10/1975 | Craft | 330/30 D |
| 3,988,595 | 10/1976 | Eatock | 307/235 F |

OTHER PUBLICATIONS

"Comparator with Hysteresis", by Gersbach in IBM Tech. Disclos. bull. vol. 19, No. 1, June 1976, p. 34.

*Primary Examiner*—Stanley D. Miller, Jr.
*Attorney, Agent, or Firm*—Michael D. Bingham

[57] ABSTRACT

A differential amplifier circuit suitable to be fabricated in monolithic integrated circuit form and having externally programmable, symmetrical input hysteresis. The differential amplifier circuit includes a differential input stage having a resistor coupled between the emitters of the differential transistors. A steering circuit comprising a second differential stage is connected across the resistor at the outputs of the collectors thereof. A differential to single ended converter circuit is utilized to provide output drive to an output multiple collector transistor from the differential input stage. A switching circuit is coupled between one collector of the output transistor to the steering circuit for selectively switching this circuit for steering current through the resistor. An external voltage is coupled across a component of the steering circuit for deriving temperature independent hysteresis. By switching the steering circuit, symmetrical hysteresis is obtained about a given level.

15 Claims, 9 Drawing Figures

COMPARISON CIRCUIT HAVING PROGRAMMABLE HYSTERESIS

BACKGROUND OF THE INVENTION

This invention relates to differential comparator amplifiers and more particularly to a differential amplifier which is suitable to be externally programmed to have symmetrical input hysteresis.

Differential amplifiers have been used for many purposes. One common use is as a zero cross detector for comparing differential input signals to produce a switching output signal in response to a predetermined relationship of the respective input signal. However, if there should be noise introduced onto the differential input signal, the zero cross detector or comparator may be falsely switched due to this noise and produce an erroneous output. For example, in contemporary antiskid braking systems, a tachometer is utilized for receiving a generally sinusoidal input signal from a sensor pickup coil which is attached to a wheel of a vehicle. The frequency of this input signal is proportional to the rotational velocity of the wheel. The tachometer responds to the input signal to generate an output direct current (DC) signal, the magnitude of which is proportional to the frequency of the input signal. Thus, if a tachometer is used for each wheel concerned with, DC signals are generated which may be compared by suitable electronics to, for instance, indicate and cause the wheels to have substantially the same braking velocity to prevent skidding, as is known.

Basically, the tachometer comprises an input circuit, usually a zero cross detector or differential comparator amplifier which is responsive to the input sine wave from the sensor pickup coil for generating a rectangular wave output signal at the zero crossings of the input sine wave. Additional circuitry is utilized for generating output signals having a constant pulse width at the leading and trailing edges of the rectangular wave. These pulses are then integrated to provide the DC output signal. Hence, as the frequency of the input varies, the time between pulses varies which in turn linearly varies the DC output signal from the integrator. Thus, the magnitude of the output signal from the tachometer can be utilized to indicate the rotational velocity of the wheel involved.

A serious problem arises because of the noise introduced on the pickup of the sensor which modulates the sine wave signal that in turn is applied to the zero cross detector circuit. At or near the zero cross over transition point of the sine wave, this noise can cause false switching of the input circuit which produces an erroneous number of output pulses. Thus the integrator circuit will produce an erroneous DC output signal having a ripple introduced thereon which reduces the accuracy of the tachometer system.

The function of the zero cross detector or comparator circuit is to switch from one state to another as the input sine wave crosses a zero threshold voltage in either a negative or positive sense. If, the magnitude of the noise is great enough, as the zero threshold point is neared, the detector circuit could be caused to alternatively switch between states as the noise modulated sine wave input signal varies above and below the zero crossover axis. A solution to eliminate this problem may be provided by programming desired hysteresis to the detector circuit to increase and decrease the threshold point to overcome the noise transients. For instance, symmetrical hysteresis is provided, if the positive going threshold voltage is placed a given voltage level above the zero cross voltage and the negative going threshold voltage is placed the same given voltage level below the zero cross voltage. Thus, if the noise peak to peak level is less than the positive and negative threshold voltages, then this noise, when algebraically added to the sine wave input signal, is prevented from causing the output to be falsely switched.

Moreover, as the hysteresis is symmetrical, the output from the detector circuit remains symmetrical so that the output of the tachometer circuit remains linearly proportional to the frequency of the input sine wave.

Thus, a need arises for a circuit capable of externally and symmetrically programming hysteresis into a comparator circuit which is otherwise susceptible to noise transients introduced to the inputs thereof.

SUMMARY OF THE INVENTION

It is an object of the present invention to provide an improved differential comparator circuit.

It is another object of the present invention to provide an input differential amplifier stage having programmable and/or symmetrical hysteresis.

It is further object of the present invention to provide a differential amplifier stage suitable to be fabricated in monolithic integrated circuit form which has externally controllable symmetrical hysteresis utilizing a single pin.

The foregoing and other objects are met by the present invention by providing a differential amplifier circuit having single point programmable symmetrical hysteresis. The differential amplifier circuit includes a differential amplifier stage having a differential resistor coupled between the otherwise common terminal of the individual electron control devices thereof, a bias circuit for establishing a predetermined threshold bias voltage, and a steering circuit coupled across the differential resistor for selectively steering current through the resistor and magnitude of voltage developed across the differential resistor which produces the symmetrical hysteresis is indicative of the value of the threshold bias voltage.

One feature of the present invention is that the differential amplifier circuit is suitable to be fabricated in monolithic integrated circuit form with hysteresis being externally programmable from an external bias circuit at a single input to the monolithic chip. A significant advantage of the above programmable hysteresis circuit is that a plurality of such circuits integrated onto one monolithic die may be programmed from one external bias point.

BRIEF DESCRIPTION OF THE DRAWINGS

FIG. 2b is a voltage diagram useful for explaining the operation of FIG. 2a;

FIG. 3b is a voltage diagram useful in explaining the operation of FIG. 3a;

FIG. 4b is a voltage diagram useful in explaining the operation of FIG. 4a;

DETAILED DESCRIPTION OF THE INVENTION

Figure 1:
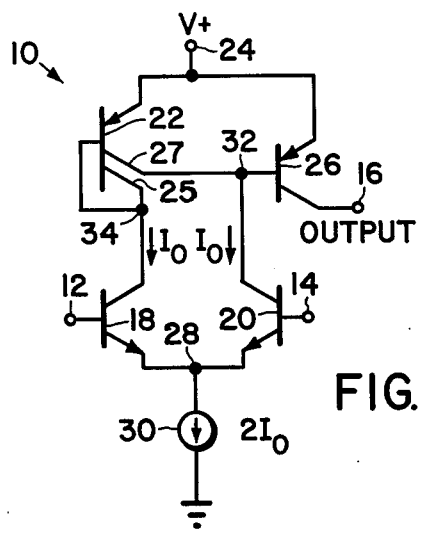
FIG. 1 is a schematic diagram of a differential to single ended comparator circuit which is useful in the explanation of the preferred embodiment of the present invention.

In FIG. 1 there is illustrated differential comparator or amplifier circuit 10 similar to the differential circuit described in U.S. Pat. No. 3,872,323, issued Mar. 18, 1975 to Thomas M. Frederiksen et al. Comparator 10 is used for providing a control operation in response to the input voltage $V_{in}$, which is applied to input terminal 12, varying about a given level. The given level may be a reference voltage, $V_{ref}$ supplied at terminal 14. As will be explained, a significant advantage of comparator circuit 10 is that there is little or substantially no offset voltage generated between switching of the circuit about the given reference voltage. This means that as the magnitude of the input voltage, $V_{in}$, approaches the value of $V_{ref}$ in a positive sense and is substantially equal thereto that the output current at output terminal 16 will change, and as $V_{in}$ approaches $V_{ref}$ in a negative sense that output current will flow when the value of $V_{in}$ is substantially $V_{ref}$. NPN transistors 18 and 20 form the two sides of the differential amplifier. A differential to single ended converter circuit comprising multiple collector transistor 22 is connected to voltage supply 24 at the emitter thereof. Transistor 22 has collector 25 connected in common to the base thereof with the junction (34) therebetween connected to the collector of transistor 18. The emitter of output PNP transistor 26 is connected to the power supply with its collector adapted to be output terminal 16. Collector 27 of transistor 22 is coupled in common to the base of transistor 26 and to the collector of transistor 20, which has the base coupled to reference terminal 14.

The common emitter junction 28, between differential transistors 18 and 20, is coupled through constant current source 30 to ground. The input voltage $V_{in}$, to be compared, is applied to the base of transistor 18.

Considering the operation of the circuit of FIG. 1, when the value of $V_{in}$ is exactly or substantially equal to $V_{ref}$ (assuming transistors 18 and 20 are balanced) equal currents flow from collector 25 and 27 through transistors 18 and 20 which are produced by constant current source 30. As shown, if current source 30 produces a current having a magnitude equal to, $2I_0$, then the currents flowing through transistors 18 and 20 are equal to the value, $I_0$, respectively. With this consideration, with transistor 22 a perfect current mirror, and because the current $I_0$ flows into junction 32 and flows thereout through transistor 20, transistor 26 does not conduct and no output current is provided at output terminal 16. Likewise, if the value of $V_{in}$ is slightly less than $V_{ref}$ then the current flowing in the collector of transistor 20 will be slightly greater than the current flowing into node 32 from collector 27 (the difference current being the base current of transistor 26). Transistor 26 is caused to be rendered conductive and current is produced at terminal 16. Therefore, the output of comparator 10 is caused to be switched about the value of $V_{ref}$ when the currents through transistors 18 and 20 are substantially equal.

In the event that differential comparator circuit 10 is imbalanced by $V_{in}$ becoming slightly greater than $V_{ref}$ so that transistor 18 is rendered more conductive than transistor 20, the current into node 32, from collector 27, is slightly greater than the current in the collector of transistor 20 forcing the base current of transistor 26 to zero and rendering the transistor non-conductive. Hence, current is produced at terminal 16 only when transistor 20 is rendered fully conductive and transistor 18 is non-conductive.

Figure 2A:
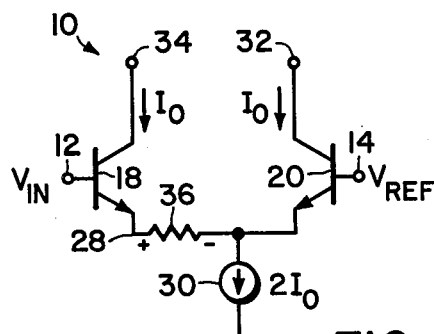
FIG. 2a is a partial schematic diagram of the single ended comparator of FIG. 1 which is modified to explain the concept of current steering in a first direction therethrough.
Figure 2B:
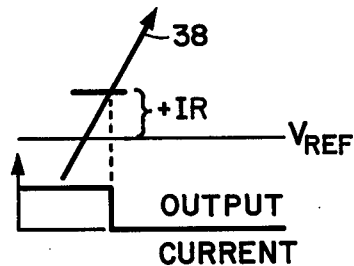

Referring to FIGs. 2a and 2b, there is shown a portion of differential comparator circuit 10 modified to provide positive input threshold, and a voltage-current diagram, respectively. As illustrated, resistor 36 has been added between emitter junction point 28 and the emitter of transistor 20. Constant current source 30 is coupled between the junction of the emitter of transistor 20 and resistor 36 to ground. As will be explained, by electronically switching current source 30 to either side of resistor 36 positive and negative hysteresis may be provided at the input of comparator 10.

As previously described, the output of comparator 10 switches about the value of $V_{ref}$ when the currents through transistors 18 and 20 are substantially equal ($I_0$). Therefore, at the switching or trip point, the current through resistor 36 is equal to the current through transistor 18, which is essentially $I_0$, and the voltage developed thereacross is therefore equal to $I_0 \times R_{36}$. This means that, at switching, an offset voltage is generated across resistor 36. As illustrated, input switching will not occur until the input voltage, $V_{in}$, (waveform 38) becomes greater than this offset voltage. Hence, assuming that transistor 20 is conducting more than transistor 18 so that transistor 26 is conductive, output current flows until the input voltage becomes positive and approaches a value, $V_{ref} + I_0R_{36}$, at which time output current from transistor 26 ceases abruptly since current into node 32 becomes greater than current out of node 32. Transistor 26 remains nonconductive until $V_{in}$ decreases to $V_{ref} + I_0R_{36}$ such that transistor 18 is rendered nonconductive. At this time base current is induced through transistor 26 which flows through transistor 20 and transistor 26 provides output current from its collector electrode to terminal 16.

What has been described then, is a circuit and method for providing a positive threshold at input terminal 12. Differential comparator 10 is not caused to switch until the input voltage becomes greater than $V_{ref}$ by a predetermined value, $I_0R$. Moreover, after once switched, the operating condition remains until the value of the input voltage decreases below the predetermined offset voltage. Therefore, if waveform 38 (FIG. 2b) is sinusoidal, as the input sine wave crosses the zero axis, the output remains the same until the desired value of the positive threshold is reached. Thereafter the output switches and remains constant until the positive half cycle of the input wave decreases below the positive threshold value. This cycle continues during each period of the input sine wave. By adjusting the amount of positive threshold, by varying either resistor 36 or current $I_0$, the amount of time that current flows out of output terminal can be varied for a given period of the input voltage.

Figure 3A:
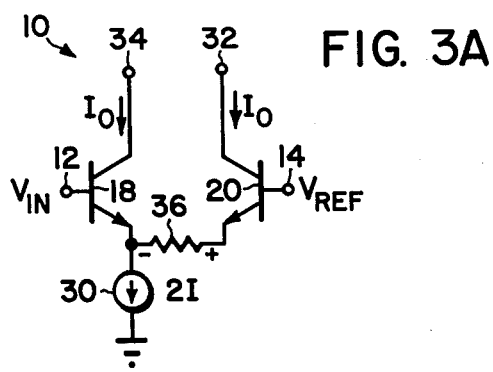
FIG. 3a is the single ended comparator of FIG. 2a showing current steering in the other direction thereof.
Figure 3B:
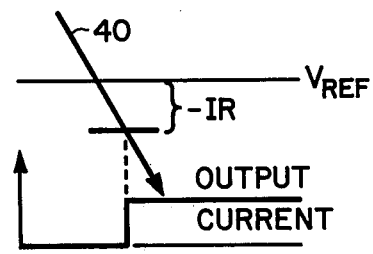

Referring now to FIGS. 3a and 3b, a negative threshold voltage can be provided at the input of differential comparator 10, as illustrated. In this situation, current flows from transistor 20 through resistor 36 such that the hysteresis is negative with respect to reference voltage, $V_{ref}$. In this case, as the value of $V_{in}$ approaches $V_{ref}$ as shown by waveform 40, comparator 10 will switch operation when the value of $V_{in}$ is less than $V_{ref}$ by the predetermined value, $-IR$. The output of the circuit then remains constant until the magnitude of $V_{in}$ increases above the negative value of the threshold voltage. The amount of negative threshold voltage, as above, may be varied by controlling the amount of current supplied by constant current source 30, or varying the value of resistor 36, for example.

Figure 4A:
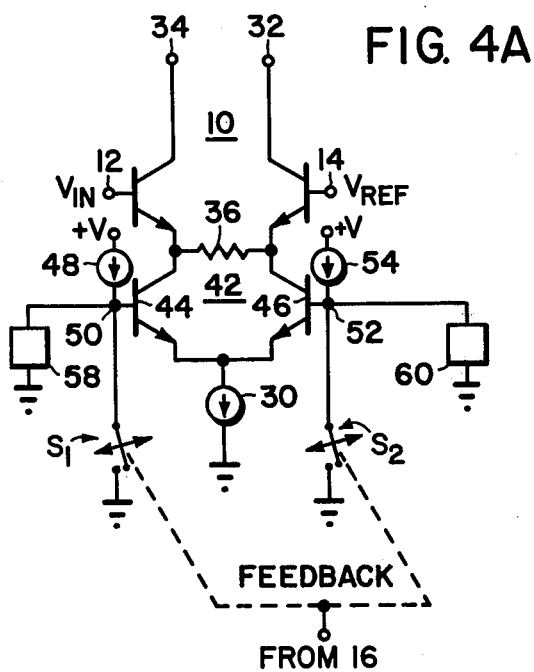
FIG. 4a is a partial schematic diagram of the single ended comparator of FIG. 1 including a current steering circuit of the preferred embodiment of the invention.

Notice that the amount of threshold voltage and the sign thereof, either negative or positive, may be controlled by varying the magnitude of and steering the current through resistor 36. To provide current steering a second differentially connected amplifier 42 is connected across the hysteresis resistor 36 (FIG. 4a). The collectors of differential transistors 44 and 46 are connected, respectively, to the emitters of transistors 18 and 20. The commonly connected emitters of transistors 44 and 46 are coupled through current source 30 to ground. The base of transistor 44 is connected to current source 48 and voltage clamp device 58 at junction 50 and is rendered conductive thereby when switch $S_1$ is opened (switch $S_2$ closed) and transistor 46 is nonconductive. The base of transistor 46 is connected at junction point 52 to current source 54, voltage clamp device 60, and to switch $S_2$ which is terminated at one terminal thereof to ground. When switch $S_1$ is closed (switch $S_2$ open), current from source 48 is short circuited to ground and transistor 44 is rendered conductive and transistor 46 is rendered conductive. Switches $S_1$ and $S_2$ are alternately activated by a feedback signal derived from output terminal 16.

Figure 4B:
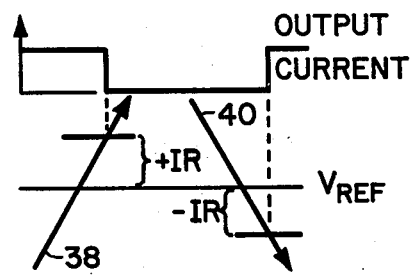

As illustrated by FIG. 4b, waveforms 38 and 40 represent expanded portions of the rising and falling slopes of input voltage $V_{in}$, which may be the positive and negative zero crossing of one half cycle of a sinusoidal input wave. By closing switch $S_1$, as $V_{in}$ approaches $V_{ref}$ in a positive sense, a positive threshold voltage is produced as explained above. By closing switch $S_2$ and opening switch $S_1$, after the input voltage has become greater (positively) than the positive threshold value, a negative threshold value is produced, as previously explained. Hence, by making both the negative and positive hysteresis values the same, and by selectively closing and opening switches $S_1$ and $s_2$ in response to a feedback signal from comparator 10, symmetrical hysteresis is provided at the input of comparator 10 and a symmetrical output current (FIG. 4b) is attained.

Figure 5:
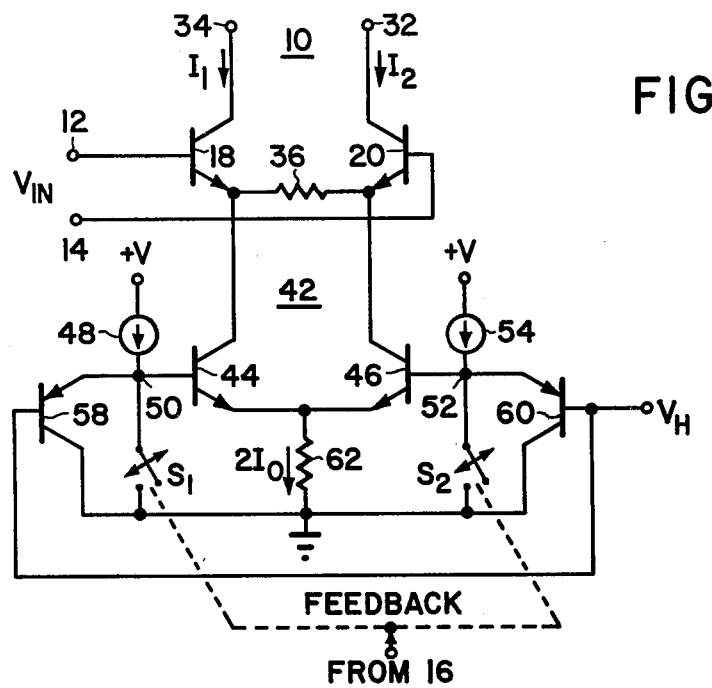
FIG. 5 is the single ended comparator circuit of FIG. 1 including a current steering circuit and switching arrangement for providing symmetrical hysteresis at the input thereof.

FIG. 5 illustrates comparator circuit 10 adapted to receive a differential input voltage across input terminals 12 and 14. Symmetrical hysteresis may be programmed at the input of the circuit which is indicative of the magnitude of $V_H$ which is applied at terminal 56 to the bases of transistors 58 and 60. The collectors of transistors 58 and 60 are connected to ground and the emitters are connected, respectively, to terminals 50 and 54. Current source 30 (FIG. 4a) has been replaced by resistor 62.

The operation of the circuit of FIG. 5 is the same as previously explained with positive and negative hysteresis being determined by current steering of the differential current through resistor 36 by alternately operating switches $S_1$ and $S_2$ by the feedback signal from transistor 26. If for example, circuit 10 is a monolithic integrated circuit, $V_H$ could be a zero temperature coefficient, externally applied voltage. As will be explained, the amount of symmetrical hysteresis is controlled by the magnitude of $V_H$, and the ratio of resistors 36 and 62. Moreover, the hysteresis is independent of operating temperature changes in the integrated circuit.

In operation, output current at terminal 16 (FIG. 1) is provided only when differential input voltage $V_{in}$ renders transistor 20 more conductive than transistor 18. Differential switching occurs identically as previously discussed. Positive and negative hysteresis (waveforms 38 and 40 of FIG. 4b) are provided by steering current through resistor 36 and transistors 46 and 44 respectively. Since both positive and the negative hysteresis is identically developed, only the function of the circuit of FIG. 5 to provide positive hysteresis is hereinbelow described.

If switch $S_1$ is closed and switch $S_2$ is opened, transistors 44 and 58 are nonconductive whereas transistors 46 and 60 are conductive. The voltage $V_H$ will then be applied through transistors 60 and 46 across resistor 62 establishing a current, $2I_0$, therethrough. As the emitter diode drops of transistors 60 and 42 cancel each other, and because $V_H$ is an externally applied, temperature independent voltage, the voltage (which is essentially $V_H$) established across resistor 62 is also temperature independent. The current $2I_0$, established by $V_H/R_{62}$ which is applied at terminal 56, is conducted through the collector emitter junction of transistor 46 and is equal to $I_1 + I_2$ (the currents through transistors 18 and 20 respectively). Remembering that the trip point (differential switching state) occurs when $I_1 = I_2 = I_0$, output switching occurs when $V_{in}$ goes positive by a value of $I_0R_{36}$ and when transistor 20 becomes less conductive than transistor 18. Thus the trip point occurs when $V_{in}$ is substantially equal to $I_0R_{36}$. However, $2I_0$ equals $V_H/R_{62}$ so that positive hysteresis is proportional to $(R_{36}R_{62} \times V_H$. In monolithic form the temperature coefficients of resistors 36 and 62 are made identical so that the ratio of the two resistors is independent of temperature. Therefore the trip point or hysteresis is only a function of $V_H$ since the ratio of the monolithic resistors can be made accurate and independent of temperature. Similarly, by opening switch $S_1$ and closing switch $S_2$, $V_H$ is applied across resistor 62 through transistors 58 and 44. Current is then steered through transistor 44 to comparator 10 for effecting a negative threshold voltage. In this operation, it can be shown that the trip point occurs at a value of, $-I_0R_{36}$, which is of equal magnitude but opposite polarity to the positive value, $I_0R_{36}$.

Figure 6:
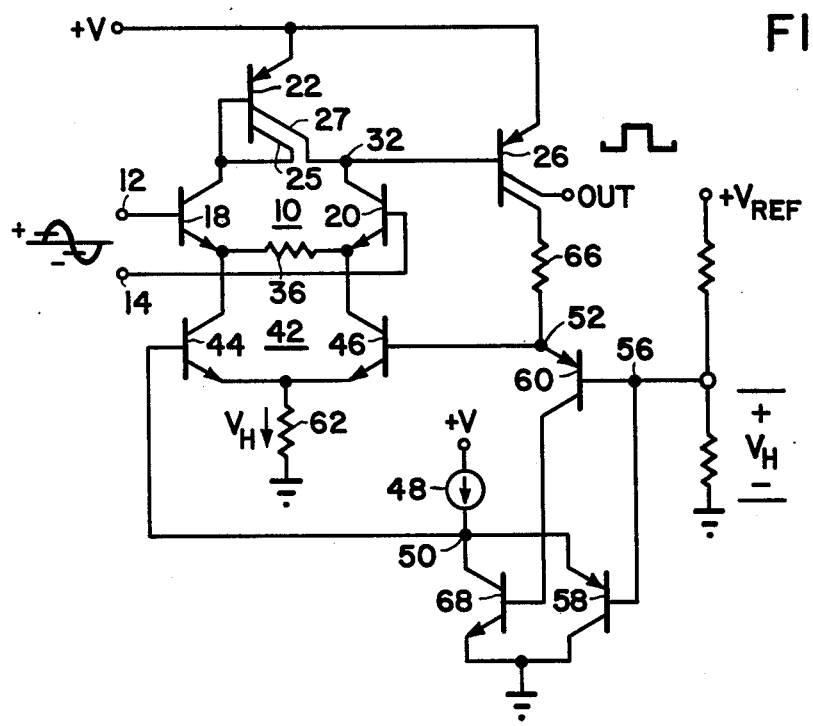
FIG. 6 is a schematic diagram of the embodiment of the present invention.

Referring now to FIG. 6, there is shown comparator 10 of the preferred embodiment of the present invention which has the described symmetrical input hysteresis characteristics. Comparator 10 is suitable for being fabricated in monolithic integrated circuit form. Symmetrical input hysteresis is externally controlled by applying a bias voltage $V_H$ at input control terminal 56. In response to an input signal, which may be sinusoidal in form, being applied to input terminals 12 and 14, rectangular output pulses are derived at output terminal 16. Comparator 10 of FIG. 6, is identical in operation to the circuit of FIG. 5, as previously discussed with the exception that the feedback signal to switch $S_2$ is developed through resistor 66 which is coupled between a second collector of multiple collector transistor 26 (which may be fabricated using known techniques) and terminal 52. Transistor 68 is also provided to complete the alternate switching circuit for alternately steering current through resistor 36. Transistor 68 has the base electrode thereof connected to the collector of transistor 60 and its collector-emitter junction connected between terminal 50 and ground.

The operation of comparator 10 for switching steering circuit 42 may now be described. With $V_{in}$ such that transistor 20 is rendered nonconductive (transistor 18 conducting), transistor 26 is off and no current flows through resistor 66 and transistors 46, 60 and 68 are off. In this state transistors 58 and 44 are rendered conductive by current source 48. This state remains until the negative trip point is reached (i.e., current is conducted through transistor 20, resistor 36 and transistor 44) and comparator 10 switches states, when transistor 20 is slightly more conductive than transistor 18. In this conditions, current flows from the base of transistor 26 rendering it conductive. With transistor 26 conducting, output current flows to output terminal 16 and through feedback resistor 66. Transistors 46, 60 and 68 are then rendered conductive. Current source 48 is then shorted to ground through transistor 68 shutting off transistors 58 and 46. The hysteresis voltage, $V_H$, supplied at terminal 56, is then applied across resistor 62 through transistors 60 and 46. Thus, as $V_{in}$ approaches zero in the positive sense, as previously described, the positive trip point is produced by the current flow through resistor 36 and transistor 46. Hence, the trip point does not occur until the positive threshold value is reached at which time comparator 10 switches states and the cycle is repeated.

Thus what has been described is a comparison circuit having externally and symmetrical, single pin, programmable input hysteresis. The comparator may be used in many environments wherein an input voltage is compared to provide an output signal for a controlling operation and which is susceptible to noise modulation. By controlling the value of hysteresis, the comparison circuit is made less susceptible to noise transients. Moreover, single pin programmability of symmetrical hysteresis provides the advantages of being able to adjust several such monolithic integrated comparison circuits from one access point to an integrated circuit chip thus reducing external pin count, if such a function is required.

What is claimed is:
1. A comparison circuit having symmetrical hysteresis, comprising:
   a differential input stage including a pair of differentially coupled devices each having first, second and input terminals, and circuit means coupled between said first terminals of said devices for establishing a hysteresis voltage thereacross in response to a current of predetermined magnitude being selectively steered therethrough, said devices receiving first and second applied input signals at said respective input terminals;
   output circuit means coupled to said second terminals of said devices being responsive to said input signals for providing a two discrete level output signal at first and second outputs respectively; and
   current steering means coupled from said first output of said output circuit means across said circuit means for selectively steering said current through said circuit means in first and second directions depending upon the operating state of said output signal from said output circuit means.
2. The comparison circuit of claim 1 wherein:
   said circuit means being a first resistor; and
   said output circuit means includes a differential to single ended converter means coupled between said second terminals of said first and second devices and a power supply, and an output electron control means having a first electrode coupled to said power supply, a control electrode coupled to said second terminal of said second device and second electrodes coupled to said first and second outputs.
3. The comparison circuit of claim 2 wherein:
   said first and second differential devices are bipolar transistors having base electrodes being said control electrodes, emitter electrodes being said first electrodes, collector electrodes being said second electrodes; and
   said output electron control means being a transistor having first and second collector electrodes, base and emitter electrodes, said base electrode being coupled to said collector electrode of said second differential device, said emitter electrode being coupled to said power supply, said first collector electrode being connected to said switching circuit means and said second collector electrode being an output of the comparison circuit.
4. The comparison circuit of claim 2 wherein said current steering means includes:
   switching circuit means coupled to said first output of said output circuit means and to a source of reference potential for producing switching signals at first and second outputs responsive to the particular state of said output signal; and
   a steering circuit having first and second input terminals coupled to said first and second output terminals of said switching circuit means, respectively, and having terminals coupled across said resistor for causing said current to be steered through said resistor in a predetermined direction in accordance with said switching signals.
5. The comparison circuit of claim 4 wherein said steering circuit includes:
   a differential stage having first and second differential devices which are coupled across said resister, said devices being differentially connected together at a common node and receive said switching signals respectively at respective input terminals; and
   current source means connected to said common node of said differential devices for providing a current having a magnitude which is indicative of said reference potential.
6. The comparison circuit of claim 5 wherein said differential stage of said steering circuit includes:
   said first and second differential devices being bipolar transistors each having base, collector and emitter electrodes, said emitter electrodes being coupled together and to said current source means at said common node, said base electrodes receiving respectively, said switching signals, said collector electrode of said first transistor being connected to a first terminal of said first resistor, said collector electrode of said second transistor being connected to said the other terminal of said first resistor, and said current source means includes a second resistor coupled from said emitter electrodes of said first and second differential devices to ground potential.
7. The comparison circuit of claim 4 wherein said switching circuit means includes:

first electron control means having first, second and control electrodes, said control electrode being coupled to said reference potential;

circuit means coupled between said first output of said comparator means, said first electrode of said first electron control means and to said first input of said steering circuit;

second electron control means having first, second and control electrodes, said control electrode being coupled to said reference potential, said first electrode being coupled to said second input of said steering circuit, said second electrode coupled to ground reference; and switching means having a first terminal coupled to said second electrode of said first electron control means, a second terminal coupled to said second input of said steering circuit and a third terminal connected to said ground reference for alternately rendering said steering circuit responsive to selectively steer said current through said first resistor of said differential input stage.

8. The comparison circuit of claim 7 wherein said switching circuit further includes said switching means comprising a current source and third electron control means, said third electron control means having first, second and control electrodes, said control electrode being coupled to said second electrode of said first electron control means, said first electrode being connected to said ground reference, said second electrode being coupled to said current source means and to said second input of said steering circuit means.

9. The comparison circuit of claim 8 wherein:

said differential input stage includes first and second transistors each having base, collector and emitter electrodes, said respective base electrodes receiving said first and second input signals;

said first resistor being connected between said emitter electrodes of said first and second differential transistors; and said output electron control means being an output transistor having base, emitter and collector electrodes, said base electrode being coupled to said collector of said second transistor, said emitter being coupled to said power supply, said collector electrodes being said first and second outputs of said comparison circuit.

10. The comparison circuit of claim 9 wherein:

said steering circuit includes another differential amplifier having first and second differentially connected transistors, the collectors thereof being coupled, respectively, to said emitters of said first and second transistors of said differential input stage, the base of said first differentially connected transistor being said first input of said steering circuit, said base of said second differentially connected transistor being said second input; and resistive means being coupled between the differentially connected emitters of said first and second differentially connected transistors of said steering circuit and said ground reference.

11. A comparison circuit suitable to be fabricated in monolithic integrated circuit form having symmetrical input hysteresis controlled by an externally applied control voltage comprising:

comparator means responsive to applied input signals for producing output signals of two discrete states, each state being indicative of predetermined threshold conditions of said input signals including resistive means across which an input offset voltage is developed to provide the symmetrical input hysteresis, the magnitude and polarity of said input offset voltage being a function of the magnitude and direction of current flow through said resistive means;

steering circuit means coupled across said resistive means having input terminals to receive, respectively, switching signals for selectively steering said current through said resistive means to change the polarity of said input offset voltage; and switching circuit means coupled between said comparator means and said input terminals of said steering circuit means for providing said switching signals in response to said states of said output signals from said comparator means, said switching means having an input to receive a control voltage, the control voltage being coupled through said switching circuit means to said steering circuit means such that a current is developed the magnitude of which is indicative of said control voltage.

12. The comparison circuit of claim 11 wherein said comparator means includes:

first electron control means having first, second and control electrodes, said control electrode receiving a first input signal, said first electrode being connected to a first terminal of said resistive means;

second electron control means having first, second and control electrodes, said control electrode receiving a second input signal, said first electrode being connected to a second terminal of said resistive means; and output circuit means coupled between a power supply potential and said second electrodes of said first and second electron control means respectively for providing said output signals at first and second outputs thereof said first output being the output of the comparison circuit, said second output being coupled to said switching circuit means.

13. The comparison circuit of claim 12 wherein said output circuit means includes:

a differential to single ended converter circuit coupled between said power supply and said second electrodes of said first and second electron control means; and output electron control means having first, second, third and control electrodes, said control electrode being connected to said second electrode of said second electron control means, aid first electrode being coupled to said power supply, said second electrode being said first output of the comparison circuit, said third electrode being said second output.

14. The comparison circuit of claim 12 wherein said steering circuit means includes:

third electron control means having first, second and control electrode, said control electrode receiving first switching signals, said second electrode being coupled to said first terminal of said resistive means;

fourth electron control means having first, second and control electrodes, said control electrode receiving second switching signals, said first electrodes being connected to said first electrode of said third electron control means, said second electrode being coupled to said second terminal of said resistive means; and first resistive circuit means connected between said first electrode of said third and fourth electron control means respectively and a ground reference.

15. The comparison circuit of claim 14 wherein said switching circuit means includes:
    second resistive circuit means having first and second terminals said first terminal being connected to said second output of said output circuit means;
    fifth electron control means having first, second and control electrodes, said control electrode receiving the control voltage, said first electrode being coupled to said second terminal of said second resistive circuit means and to said control electrode of said fourth electron control means of said steering circuit means;
    sixth electron control means having first, second, and control electrodes, said control electrode receiving the control voltage, said first electrode being connected to said control electrode of said third electron control means of said steering circuit means, said second electrode being coupled to said ground reference;
    seventh electron control means having first, second and control electrodes, said control electrode being coupled to said second electrode of said fifth electron control means, said first electrode being coupled to said ground reference, said second electrode being connected to said control electrode of said third electron control means; and
    current source means connected to said control electrode of said third electron control means.

* * * * *